United States Patent [19]

Diba

[11] Patent Number: 5,489,866
[45] Date of Patent: Feb. 6, 1996

[54] HIGH SPEED AND LOW NOISE MARGIN SCHMITT TRIGGER WITH CONTROLLABLE TRIP POINT

[75] Inventor: Sholeh Diba, San Jose, Calif.

[73] Assignee: Xilinx, Inc., San Jose, Calif.

[21] Appl. No.: 229,977

[22] Filed: Apr. 19, 1994

[51] Int. Cl.[6] .............................. H03K 3/037; H03K 3/12
[52] U.S. Cl. .................... 327/206; 327/205; 327/399; 327/434
[58] Field of Search .................... 327/312, 317, 327/323, 328, 112, 534, 535, 205, 206, 208, 314, 313, 374, 376, 379, 381, 389, 392, 434, 399

[56] References Cited

U.S. PATENT DOCUMENTS

| | | | |
|---|---|---|---|
| 4,539,489 | 9/1985 | Vaughn | 327/206 |
| 4,849,653 | 7/1989 | Imai et al. | 327/206 |
| 4,875,130 | 10/1989 | Huard | 327/318 |
| 5,177,376 | 1/1993 | Wellnitz et al. | 327/205 |

*Primary Examiner*—Timothy P. Callahan
*Assistant Examiner*—Jung Ho Kim
*Attorney, Agent, or Firm*—Edel M. Young; Norman R. Klivans

[57] ABSTRACT

An improved Schmitt trigger, especially useful for large scale integrated circuit applications, includes a buffer (inverter) having a pull up device and two pull down devices all connected between a voltage supply and ground, and each receiving the input signal at its gate terminal. A node between the output terminals of the pull down devices is connected to the output terminal of the Schmitt trigger. A feedback line connects the output terminal of the Schmitt trigger to the gate of an N-channel depletion device connected between the pull-up and pull-down devices. Also provided are two devices to control the timing of the Schmitt trigger; these two control devices are connected between the output terminal of the Schmitt trigger and the output terminal of the inverter.

Also provided in one embodiment is electrostatic discharge protection connected to the Schmitt trigger input and output terminals, and in another embodiment a control device for turning on and off the supply voltage to the inverter.

10 Claims, 3 Drawing Sheets

HIGH SPEED AND LOW NOISE MARGIN SCHMITT TRIGGER WITH CONTROLLABLE TRIP POINT

BACKGROUND OF THE INVENTION

1. Field of the Invention

This invention pertains to Schmitt triggers, and more particularly to Schmitt triggers having narrow noise margins and operating at high speed.

2. Description of the Prior Art

The Schmitt trigger is a well known electronic circuit which produces a uniform amplitude output pulse from a random amplitude input signal, and has applications in pulse systems. Schmitt triggers are often used in an input circuit of a large scale integrated circuit ("chip") for receiving a signal from outside the chip and generating in response a signal of uniform amplitude and duration for use by the internal logic of the chip. A typical application of a Schmitt trigger is described in copending and commonly owned U.S. patent application Ser. No. 08/230,045 invented by Sholeh Diba and titled "Integrated Circuit One Shot with Extended Length Output Pulse" incorporated herein by reference.

A prior art Schmitt trigger is shown in FIG. 1. An input signal is provided to input terminal 10 which is connected to the gate electrodes of respectively P-channel transistor Q1, P-channel transistor Q2, N-channel transistor Q3, and N-channel transistor Q4. Each transistor shown in this figure has an associated numeral shown on the figure which depicts the relative size (width) of the gate electrode of that particular transistor. It is understood that the length of each gate electrode is uniform, being in one example 1.0 microns (μm).

As shown, a node between transistors Q2 and Q3 is connected to the output terminal 20, which is also connected to the gate electrode terminal of P-channel transistor Q5 and of N-channel transistor Q6. Also provided is N-channel transistor Q7, the gate terminal of which is connected to a source voltage $V_{cc}$. Similarly, transistors Q1, Q2, Q3 and Q4 are connected between the source voltage $V_{cc}$ and ground ($V_{ss}$).

This typical Schmitt trigger produces the output signal waveform shown adjacent to output terminal 20.

The operation of this circuit is as follows. When the output signal at terminal 20 goes high, transistor Q6 turns on (becomes conductive) and hence node A will be held at a high voltage. Thus the output signal at terminal 20 will not be disturbed by any input signal noise. This means that if there is any noise applied to the input signal transistors Q3 and Q4 at terminal 10, this noise would not propagate to the output terminal 20. The same situation applies to transistor Q5 when the output signal goes low. Thus transistor Q5 turns on, while transistor Q7 is on at all times. Therefore node B is pulled down (low) to 0 volts, so that any noise at the input terminal 10 is not able to propagate to the output terminal 20. Thus there must be a significant transition in the input signal in order to pull node B to the voltage of $V_{cc}$, or to pull node A to the voltage of $V_{ss}$ (ground).

The circuit of FIG. 1 has a typical "noise margin" in excess of about one volt. Thus, for example, the low trigger point voltage is 1.7 volts and the high trigger point voltage is 2.7 volts. That is to say, the output signal will be "high" if the input signal voltage (amplitude) exceeds 2.7 volts, and will be "low" if the input signal voltage is below 1.7 volts.

However for a circuit which is intended to operate quickly, i.e. switch quickly in response to randomly varying input signals, it is desirable to have a lower noise margin, for instance, 0.5 volts. Thus, for instance, the low trigger point would desirably be 1.2 volts and the high trigger point 1.7 volts. Thus the noise margin is essentially the amplitude difference between the high and low trigger points. It is also desirable for the Schmitt trigger to respond more quickly to a change in signal amplitude then does the circuit of FIG. 1. These features are especially important when the Schmitt trigger is part of a large scale integrated circuit and associated with an input terminal (pin) of the integrated circuit chip, to improve the speed of the circuit; however, prior art Schmitt triggers do not provide these advantages.

SUMMARY OF THE INVENTION

An improved Schmitt trigger, especially useful for large scale integrated circuit applications, includes a buffer (inverter) having a pull up device and two pull down devices all connected between a voltage supply and ground, and each receiving the input signal at its gate terminal. A node between the output terminals of the pull down devices is connected to the output terminal of the Schmitt trigger. A feedback line connects the output terminal of the Schmitt trigger to the gate of an N-channel depletion device connected between the pull-up and pull-down devices. Also provided are two devices to control the timing of the Schmitt trigger; these two control devices are connected between the output terminal of the Schmitt trigger and the output terminal of the inverter.

Also provided in one embodiment is electrostatic discharge protection connected to the Schmitt trigger input and output terminals, and in another embodiment a control device for turning on and off the supply voltage to the inverter. Also provided (as an option) is an additional device connected between the inverter pull down devices and the Schmitt trigger output terminal, for optionally changing the duration of the low going signal edge of the output signal.

It is to be understood that the term "Schmitt trigger" as used herein refers to a broad class of signal sensors, and is not intended to be limiting to those circuits explicitly called "Schmitt triggers" in the art.

DETAILED DESCRIPTION OF THE INVENTION

Figure 1:
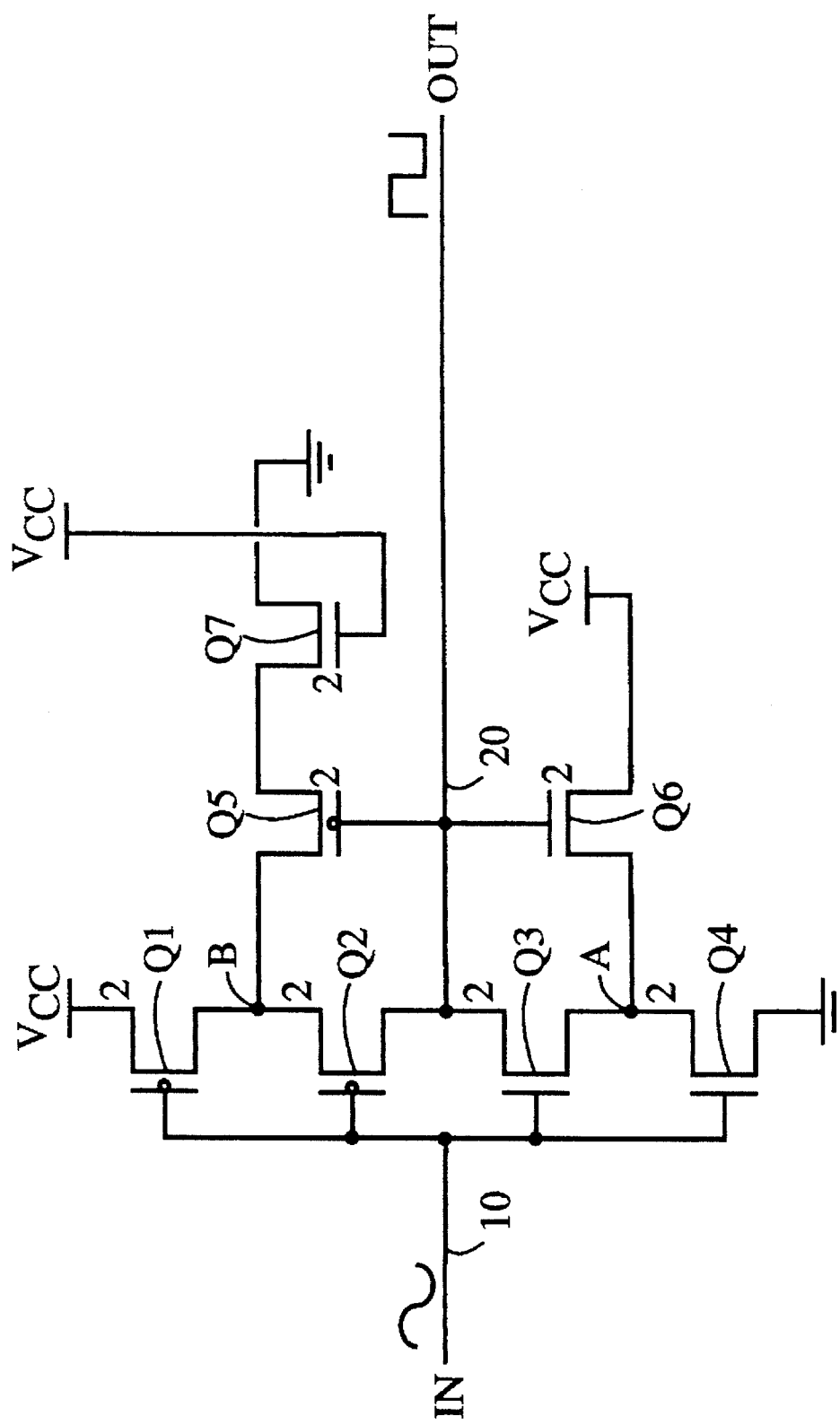
FIG. 1 shows a prior art Schmitt trigger.
Figure 2:
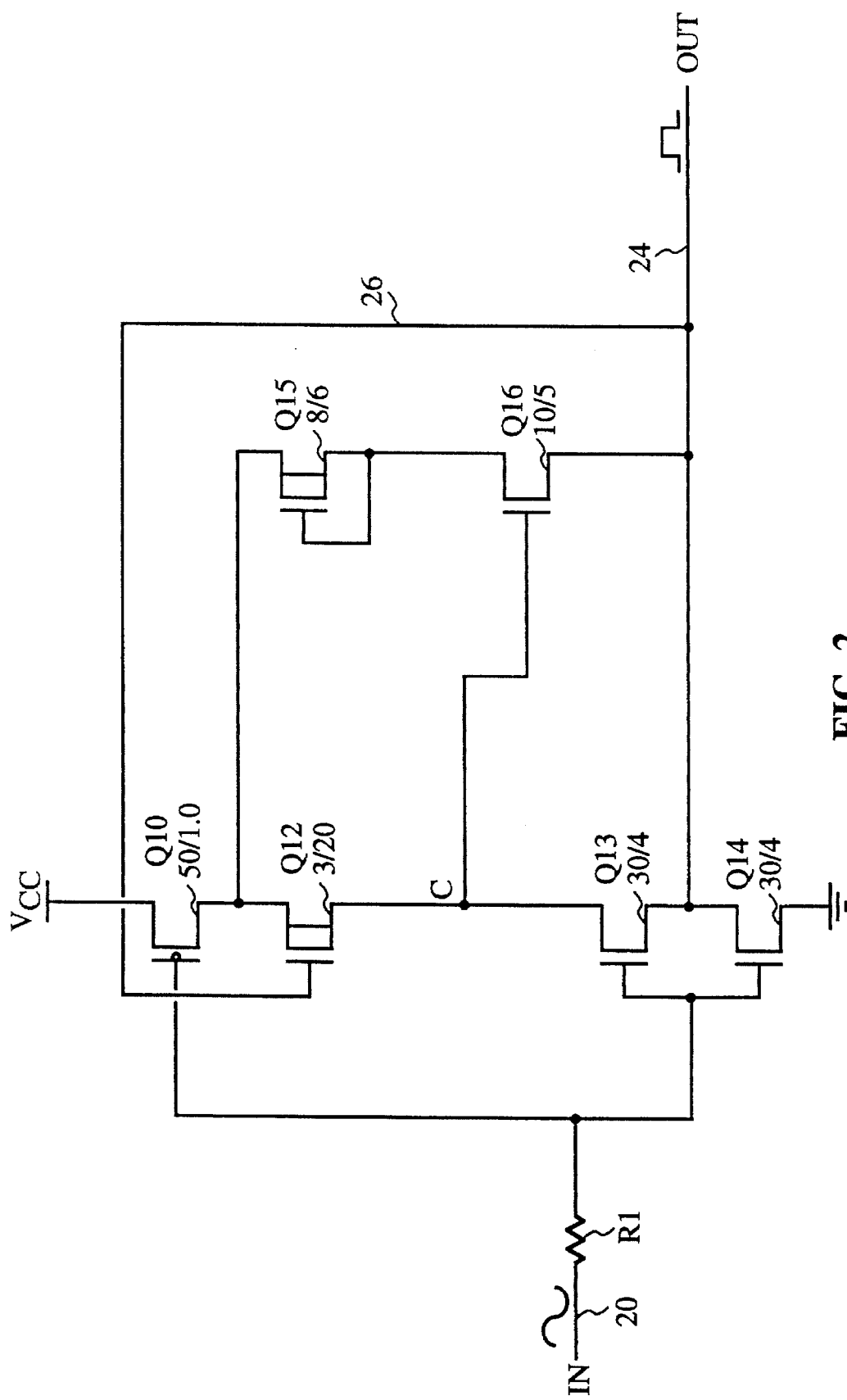
FIG. 2 shows a Schmitt trigger in accordance with the present invention.

FIG. 2 shows a Schmitt trigger in one embodiment of the invention. An input signal (depicted next to terminal 20) is provided at input terminal 20 to resistor R1, which in one embodiment has a value of 50 Ohms. (It is to be understood that the device values and dimensions disclosed herein are exemplary and not limiting). The input signal at terminal 20 is hence provided to the gate electrodes of respectively P-channel pull up transistor Q10, and N-channel pull down transistors Q13 and Q14. The size (area) of the gate electrode (in terms of width by length) is shown for each transistor i.e., the gate electrode of transistor Q10 is 50 microns wide by 1.0 microns long.

Transistors Q10, Q13, and Q14 are connected between voltage supply $V_{cc}$ and ground. A node connected between the source terminal of transistor Q13 and the drain terminal of transistor Q14 is connected to the output terminal 24. Feedback line 26 is connected between output terminal 24 and the gate electrode of N-channel depletion mode transistor Q12. A node C between the output terminals of transistors Q12 and Q13 connects to the gate electrode of N-channel control transistor Q16. Depletion mode N-channel transistor Q15 is a second control transistor connected as shown between transistor Q16 and the node between transistors Q10 and Q12. The gate terminal of transistor Q15 is shorted to either the drain or source terminal thereof (so that transistor Q15 serves as a delay or timing control device).

In terms of operation, transistors Q15 and Q16 provide timing for proper switching between the positive amplitude portion of the output signal and the lower negative amplitude portion thereof, to insure fast response time of the output signal to changes in the input signal.

When the input signal at terminal 20 is high, P-channel transistor Q10 will be off (non-conductive) and N-channel transistors Q13 and Q14 will be on (conductive). Conversely, when the input signal is low, P-channel transistor Q10 will be on and N-channel transistors Q13 and Q14 will be off. Thus disregarding the effects of the rest of the circuit, this is essentially an inverting circuit. The control transistors Q15 and Q16 control the timing of the high and low portions of the output signal at terminal 24. Thus a high output signal will turn N-channel depletion mode transistor Q12 fully on via feedback line 26.

The operation of the circuit of FIG. 2 is as follows. When the signal applied to input terminal 20 is at 0 volts (low), the output signal at terminal 24 is at e.g. 4 volts (high). When the input signal at terminal 20 starts going high, transistors Q13 and Q14 begin turning on and node C hence goes low. Thus transistor Q16 is turned off. Thus the circuit path from voltage source $V_{cc}$ is shut off faster. In other words, since transistor Q16 turns off faster than transistor Q10, transistor Q16 causes the output signal at output terminal 24 to switch faster because the only path from voltage source $V_{cc}$ to the output at terminal 24 is through transistor Q16 (since transistors Q13 and Q14 switch together).

Figure 3:
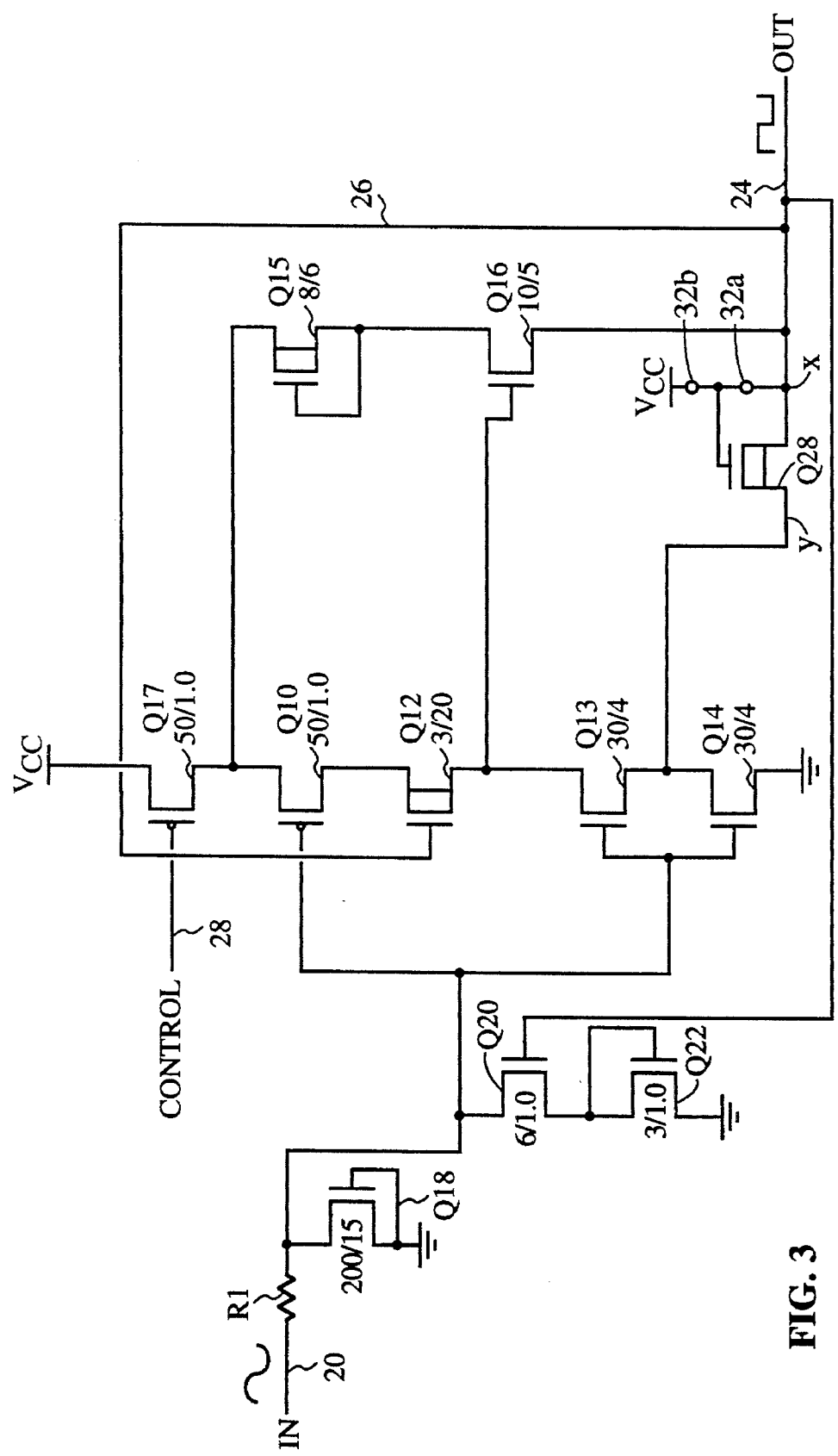
FIG. 3 shows a second Schmitt trigger in accordance with the present invention.

The Schmitt trigger of FIG. 3 includes many elements identical to those of FIG. 2 (and similarly labelled) and also includes additional elements. The first additional element is electrostatic discharge (ESD) transistor Q18 which is an N-channel transistor with its gate electrode shorted to its source terminal for provision of electrostatic discharge protection at input terminal 20. Similarly, N-channel transistors Q20 and Q22 provide electrostatic discharge protection between input terminal 20 and output terminal 24. Note that in this case transistor Q18 and transistor Q22 operate as diodes.

Another additional element in FIG. 3 is the control transistor Q17, which is a P-channel transistor having its gate terminal connected to a control terminal 28 for turning on or off the provision of the voltage supply $V_{cc}$ to the pull up transistor Q10 and pull down transistors Q13, Q14. Thus effectively the control terminal 28 is an enablement terminal which receives an externally provided enablement signal for turning the Schmitt trigger on or off. This is done typically to conserve power and to have one more signal for controlling the output.

The last additional feature in FIG. 3 (compared to the circuit of FIG. 2) is N-channel depletion mode transistor Q28 connected as shown by e.g. mask optional jumpers 32a, 32b. At any one time one of jumpers 32a, 32b will be connected. When connected, jumper 32a shorts the gate terminal of transistor Q28 to the right side of transistor Q28 (i.e., to terminal 24).

Transistor Q28 functions as a delay element and thereby changes the duration of the low going edge of the output signal, increasing it by approximately 0.2 nanoseconds if the right side thereof is connected by jumper 32b. If the 0.2 nanosecond delay is not needed, one disconnects jumper 32a and connects jumper 32b, thus connecting the gate terminal of transistor Q28 to voltage supply $V_{cc}$. Thus transistor Q28 would have no effect on the output signal. Thus transistor Q28 is never turned off but can limit the current, thus slowing down the provision of the output signal.

When jumper 32b is connected and jumper 32a is disconnected and the output signal is high, then transistor Q28 is fully on when transistors Q13 and Q14 turn on (the input signal is high). Node Y will then start going low, so node X will also start going low. Thus transistor Q28 will be slowly turning off. Thus transistor Q28 will slow down the effect of the signal at node Y on the output terminal 24 by 0.2 nanoseconds. Thus effectively transistors Q13 and Q14 are controlling, at the location of jumper 32b, the duration of the output signal at terminal 24.

In the embodiment of FIG. 2, the relative sizes (hence current driving capability) of transistors Q12, Q13, Q14, Q15 and Q16 are as shown to achieve the desired timing and noise window margin. It is to be understood that the exact sizes are not critical; however, the ratio of sizes i.e., gate electrode area (and hence current driving strength), controls the timing and noise margin. Also, as is well known, the ratio of width to length of each transistor also matters. Thus the nature of the output signal is dependent on the relative (not absolute) dimensions of these particular transistors. The sizes given in FIG. 2 generate trip points of 1.2 volts for turning off and 1.7 volts for turning on. Thus the noise margin is 0.5 volts. To move the turn-off trip point from 1.2 volts to 1.4 volts, the width/length of depletion mode transistor Q12 can be changed from 3/20 to either about 6/20 or about 3/10. The higher width and shorter length cause depletion mode transistor Q12 to turn on faster. Therefore, the output voltage can switch sooner. To move the turn-on trip point from 1.7 volts to 1.9 volts, the width/length of transistors Q13 and Q14 can each be changed from 30/4 to 20/4. This change will also change the turn-off trip point from about 1.2 volts to about 1.4 volts. If the width of transistor Q15 is increased, the turn-on trip point will decrease. For example, if the width of transistor Q15 is increased from 8 microns to 10 microns, the turn-off trip point will decrease from about 1.7 volts to about 1.6 volts. Transistor Q16 also has a slight effect on the turn-on trip point. If the width of transistor Q16 is changed from 8 microns to about 20 microns, the turn-on trip point will change from about 1.7 volts to about 1.65 volts. The above relationships make it possible to generate carefully controlled turn-on and turn-off trip points, and therefore carefully controlled noise margins and speed characteristics.

It is to be understood that in one embodiment the Schmitt triggers of FIGS. 2 and 3 are fabricated by conventional CMOS large scale integrated circuit fabrication techniques. However, these circuits may also be fabricated using other types of semiconductor fabrication processes, or made of discrete components.

This disclosure is illustrative and not limiting; further modifications will be apparent to one of ordinary skill in the art and are intended to be covered by the appended claims.

I claim:

1. A trigger circuit comprising;

an input terminal;

a pull up device and at least one pull down device, each having a source and a drain, the source of the pull up device being connected to a first voltage and the source of the pull down device being connected to a second voltage wherein the second voltage is less than the first voltage, and each having a gate connected to the input terminal;

an output terminal connected to the drain of the pull down device;

a control device connected between the pull up device and the pull down device and also connected to the output terminal; and a feedback line connected to the output terminal which controls a conductivity of the control device; wherein the control device includes a first and a second transistor connected in series between the drain of the pull up device and the output terminal, thereby providing timing for proper switching for an output signal at the output terminal.

2. The trigger circuit of claim 1, in which the control device comprises:

a first N-channel depletion mode transistor connected between the pull up and pull down devices; and the first transistor is an N-channel transistor and the second transistor is a second N-channel depletion mode transistor, the second N-channel depletion mode transistor having a drain connected to the drain of the pull up device and having its gate and source shorted together, and the N-channel transistor having a source connected to the output terminal and a gate connected to the drain of the pull down device.

3. The trigger circuit of claim 2, further comprising an additional pull down device connected between the pull down device and the pull up device.

4. The trigger circuit of claim 1, further comprising a current flow control element connected between the pull down device and the output terminal.

5. The trigger circuit of claim 1, further comprising an electrostatic discharge protection element connected to the input terminal.

6. The trigger circuit of claim 1, further comprising an electrostatic discharge protection circuit connected between the input and output terminals.

7. The trigger circuit of claim 1, further comprising a power control element connected between the pull up device and the first voltage.

8. The trigger circuit of claim 3, wherein the relative widths and lengths of the elements are as follows:

| pull-up device | 50/1 |
| pull-down device | 30/4 |
| first N-channel depletion mode transistor | 3/20 |
| first N-channel transistor | 10/15 |
| second N-channel depletion mode transistor | 8/6 |
| second pull-down device | 30/4. |

9. A trigger circuit comprising:

an input terminal;

a pull up device and at least one pull down device, each having a source and a drain, the source of the pull up device being connected to a first voltage and the source of the pull down device being connected to a second voltage wherein the second voltage is less than the first voltage, and each having a gate connected to the input terminal;

an output terminal connected to the drain of the pull down device;

a control device connected between the pull up device and the pull down device and also connected to the output terminal; and a feedback line connected to the output terminal which controls a conductivity of the control device;

wherein the control device comprises:

a first N-channel depletion mode transistor connected between the pull up and pull down devices; and an N-channel transistor and a second N-channel depletion mode transistor connected in series between the drain of the pull up device and the output terminal, the second N-channel depletion mode transistor having a drain connected to the drain of the pull up device and having its gate and source shorted together, and the N-channel transistor having a source connected to the output terminal and a gate connected to the drain of the pull down device.

10. A trigger circuit comprising:

an input terminal;

a pull up device and at least one pull down device, each having a source and a drain, the source of the pull up device being connected to a first voltage and the source of the pull down device being connected to a second voltage wherein the second voltage is less than the first voltage, and each having a gate connected to the input terminal;

an output terminal connected to the drain of the pull down device;

a control device connected between the pull up device and the pull down device and also connected to the output terminal;

a feedback line connected to the output terminal which controls a conductivity of the control device; and an electrostatic discharge protection circuit connected between the input terminal and the output terminal.

* * * * *